(12) United States Patent
Hennessy et al.

(10) Patent No.: US 9,069,255 B2
(45) Date of Patent: Jun. 30, 2015

(54) CARRIER SHEET FOR A PHOTOSENSITIVE PRINTING ELEMENT

(76) Inventors: Jim Hennessy, Woburn, MA (US);
David X. Elwell, Kennesaw, GA (US);
Nicholas R. Pina, North Falmouth, MA (US); Brian Cook, Roswell, GA (US);
Ryan Vest, Cumming, GA (US)

(*) Notice: Subject to any disclaimer, the term of this patent is extended or adjusted under 35 U.S.C. 154(b) by 1433 days.

(21) Appl. No.: 12/620,715

(22) Filed: Nov. 18, 2009

(65) Prior Publication Data
US 2011/0117500 A1 May 19, 2011

(51) Int. Cl.
*B41N 6/00* (2006.01)
*B41N 10/02* (2006.01)
*G03F 7/34* (2006.01)
*B41F 27/00* (2006.01)

(52) U.S. Cl.
CPC ... *G03F 7/34* (2013.01); *B41N 6/00* (2013.01);
*B41N 10/02* (2013.01); *B41F 27/00* (2013.01)

(58) Field of Classification Search
USPC ........................................ 101/401.1; 430/306
See application file for complete search history.

(56) References Cited

U.S. PATENT DOCUMENTS

| | | | |
|---|---|---|---|
| 3,060,023 A | | 10/1962 | Burg et al. |
| 3,351,009 A | * | 11/1967 | Plank .......................... 101/401.1 |
| 4,547,453 A | | 10/1985 | Worns et al. |
| 5,175,072 A | | 12/1992 | Martens |
| 5,262,275 A | | 11/1993 | Fan |
| 5,279,697 A | | 1/1994 | Peterson et al. |
| 5,325,776 A | | 7/1994 | Rather et al. |
| 5,476,712 A | | 12/1995 | Hartman et al. |
| 5,704,291 A | * | 1/1998 | Lewis ........................... 101/376 |
| 5,894,799 A | | 4/1999 | Bart et al. |
| 5,925,500 A | | 7/1999 | Yang et al. |

(Continued)

FOREIGN PATENT DOCUMENTS

| | | |
|---|---|---|
| EP | 1 239 329 | 9/2002 |
| WO | 01/18604 | 3/2001 |
| WO | 01/88615 | 11/2001 |

*Primary Examiner* — Jill Culler
(74) *Attorney, Agent, or Firm* — Carmody Torrance Sandak & Hennessey LLP

(57) ABSTRACT

An improved apparatus for thermally developing a flexographic printing element to reveal a relief image on the surface and a method of using the apparatus to develop a flexographic printing element. The apparatus typically comprises means for softening or melting a crosslinked photopolymer on the imaged and exposed surface of the flexographic printing element; at least one roll that is contactable with the imaged surface of the flexographic printing element and capable of moving over at least a portion of the imaged surface of the flexographic printing element to remove the softened or melted non-crosslinked photopolymer on the imaged and exposed surface of the flexographic printing element; and means for maintaining contact between the at least one roll and the imaged and exposed surface of the flexographic printing element. A layer of resilient compressible material is positioned between the flexographic printing element and a supporting conveying means. The means for softening or melting non-crosslinked photopolymer on the imaged and exposed surface of the flexographic printing element comprise a heater positioned adjacent to the imaged surface of the flexographic printing element and/or heating the at least one roll that contactable with the imaged surface of the flexographic printing element. The apparatus may also contain an exposure device to crosslink and cure the imaged surface of the flexographic printing element prior to thermal development.

10 Claims, 1 Drawing Sheet

(56) References Cited

U.S. PATENT DOCUMENTS

| | | |
|---|---|---|
| 6,238,837 B1 | 5/2001 | Fan |
| 6,247,403 B1 | 6/2001 | Randazzo |
| 6,536,342 B2 * | 3/2003 | Rodgers ............. 101/379 |
| 6,605,410 B2 | 8/2003 | Yang et al. |
| 6,640,711 B2 * | 11/2003 | Smoot et al. ............. 101/375 |
| 6,666,138 B2 | 12/2003 | Randazzo |
| 6,703,095 B2 * | 3/2004 | Busshoff et al. ............. 101/375 |
| 6,772,686 B2 | 8/2004 | Van Wert |
| 6,797,371 B1 | 9/2004 | Gehlsen et al. |
| 6,797,454 B1 | 9/2004 | Johnson et al. |
| 7,044,055 B2 * | 5/2006 | Gotsick et al. ............. 430/306 |
| 7,152,529 B2 * | 12/2006 | Gotsick et al. ............. 430/306 |
| 7,232,649 B2 * | 6/2007 | Vest ............. 430/306 |
| 2003/0180655 A1 | 9/2003 | Fan et al. |
| 2003/0211423 A1 | 11/2003 | Mengel et al. |
| 2004/0237818 A1 | 12/2004 | Rodgers |
| 2006/0081142 A1 | 4/2006 | Gotsick et al. |
| 2006/0210928 A1 | 9/2006 | Vest |
| 2006/0292495 A1 | 12/2006 | Roshelli, Jr. et al. |
| 2007/0041741 A1 | 2/2007 | Roberts et al. |

* cited by examiner

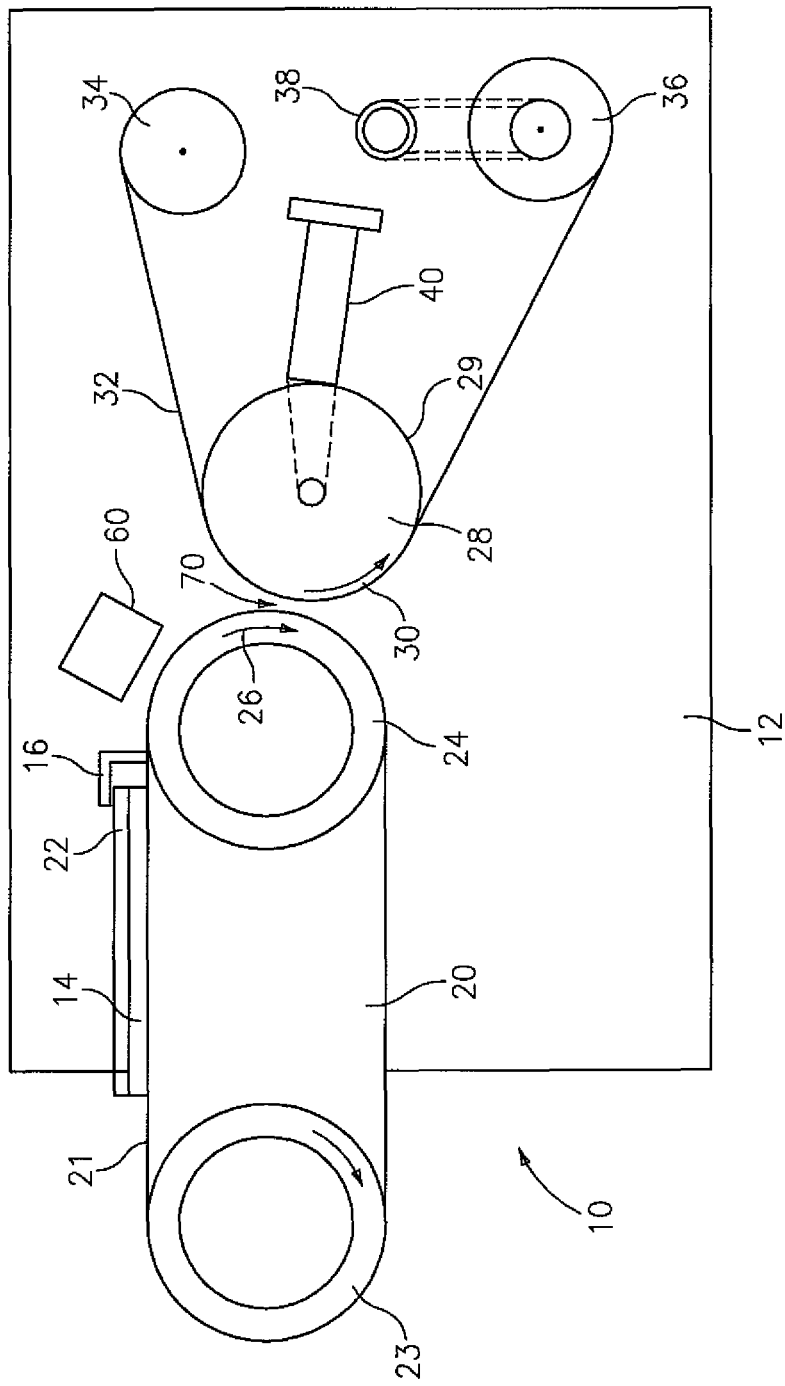

CARRIER SHEET FOR A PHOTOSENSITIVE PRINTING ELEMENT

FIELD OF THE INVENTION

The present invention is directed to an improved processor and method for use in thermally developing photosensitive printing elements.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Such plates offer a number of advantages to the printer, based chiefly on their durability and the ease with which they can be made.

Although photopolymer printing elements are typically used in "flat" sheet form, there are particular applications and advantages to using the printing element in a continuous cylindrical form, as a continuous in-the-round (CITR) photopolymer sleeve. CITR photopolymer sleeves add the benefits of digital imaging, accurate registration, fast mounting, and no plate lift to the flexographic printing process. CITR sleeves have applications in the flexographic printing of continuous designs such as in wallpaper, decoration and gift-wrapping paper, and other continuous designs such as tablecloths, etc. CITR sleeves enable flexographic printing to be more competitive with gravure and offset on print quality.

A typical flexographic printing plate as delivered by its manufacturer is a multilayered article made of, in order, a backing or support layer, one or more unexposed photocurable layers, a protective layer, slip film and/or laser ablatable layer, and a cover sheet. A typical CITR photopolymer sleeve generally comprises a sleeve carrier (support layer) and at least one unexposed photocurable layer on top of the support layer.

A flexographic printing element is produced from a photocurable printing blank by imaging the photocurable printing blank to produce a relief image on the surface of the printing element. This is generally accomplished by selectively exposing the photo curable material to actinic radiation, which exposure acts to harden or crosslink the photo curable material in the irradiated areas. The photocurable printing blank contains one or more layers of an uncured photocurable material on a suitable backing layer. The photocurable printing blank can be in the form of a continuous (seamless) sleeve or as a flat, planar plate that is mounted on a carrier sleeve.

The photopolymers used generally contain binders, monomers, photoinitiators, and other performance additives. Various photopolymers such as those based on polystyrene-isoprene-styrene, polystyrene-butadiene-styrene, polyurethanes and/or thiolenes as binders are useful. Preferable binders are polystyrene-isoprene-styrene, and polystyrene-butadiene-styrene, especially block co-polymers of the foregoing.

The printing element is selectively exposed to actinic radiation in one of three related ways. In the first alternative, a photographic negative with transparent areas and substantially opaque areas is used to selectively block the transmission of actinic radiation to the printing plate element. In the second alternative, the photopolymer layer is coated with an actinic radiation (substantially) opaque layer that is sensitive to laser ablation. A laser is then used to ablate selected areas of the actinic radiation opaque layer creating an in situ negative. This technique is well-known in the art, and is described for example in U.S. Pat. Nos. 5,262,275 and 6,238,837 to Fan, and in U.S. Pat. No. 5,925,500 to Yang et al., the subject matter of each of which is herein incorporated by reference in its entirety. In the third alternative, a focused beam of actinic radiation is used to selectively expose the photopolymer. Any of these alternative methods is acceptable, with the criteria being the ability to selectively expose the photopolymer to actinic radiation thereby selectively curing portions of the photopolymer.

Next, the photopolymer layer of the printing element is developed to remove uncured (i.e., non-crosslinked) portions of the photopolymer, without disturbing the cured portions of the photopolymer layer, to produce the relief image. The development step has traditionally been accomplished in a variety of ways, including water washing, solvent washing, and thermal development (blotting). Thermal development has the advantage of not requiring an additional drying step after development and thus provides the ability to go more quickly from plate to press.

Processes have been developed whereby photopolymer printing plates are prepared using heat and the differential melting temperature between cured and uncured photopolymer is used to develop the latent image. The basic parameters of this process are known, as described in U.S. Pat. Nos. 5,279,697, 5,175,072 and 3,264,103, in published U.S. patent publication Nos. US 2003/0180655, and U.S. 2003/0211423, and in WO 01/88615, WO 01/18604, and EP 1239329, the teachings of each of which are incorporated herein by reference in their entirety. These processes allow for the elimination of development solvents and the lengthy plate drying times needed to remove the solvent. The speed and efficiency of these processes allow for their use in the manufacture of flexographic plates for printing newspapers and other publications where quick turnaround times and high productivity are important.

In order for the printing plate to be thermally developable, the composition of the photopolymer must be such that there exists a substantial difference in the melt temperature between the cured and uncured polymer. It is precisely this difference that allows the creation of an image in the photopolymer when heated. The uncured photopolymer (i.e., the portions of the photopolymer not contacted with actinic radiation) melts and/or substantially softens while the cured photopolymer remains solid and intact at the temperature chosen. Thus, the difference in melt temperature allows the uncured photopolymer to be selectively removed thereby creating the desired image.

Thereafter, uncured photopolymer can be softened and/or melted and removed. In most instances, the heated printing element is contacted with an absorbent material that absorbs or otherwise removes the softened and/or melted uncured photopolymer. This removal process is generally referred to as "blotting".

Upon completion of the blotting process, the printing plate element may be post-exposed to further actinic radiation and/or subjected to detackification, cooled and is then ready to use.

However, when thin (e.g., 0.045 inch or less) printing plates are processed in the thermal processor, the plates tend to wrinkle which causes problems in print quality. In attempting to solve this problem, the inventors of the present invention have studied various processor speeds and processing conditions. The inventors herein have discovered that when a resilient compressible backing sheet is place under the photopolymer plate when being processed with heat, wrinkling of the plate is reduced or eliminated.

SUMMARY OF THE INVENTION

The present invention comprises an improved thermal development apparatus and a method of using the improved thermal development apparatus to remove uncured photopolymer from the imaged surface of a flexographic printing element. In another embodiment, the present invention comprises an improved apparatus and method that can eliminate or minimize wrinkling of the flexographic plate upon thermal development.

In a preferred embodiment, the apparatus comprises:
(i) means to support, and preferably rotate, a flexographic printing element;
(ii) optionally, but preferably means for exposing an imaged surface of the flexographic printing element, said means comprising one or more sources of actinic radiation; and
(iii) means for thermally developing an imaged and exposed surface of the flexographic printing select, said thermally developing means comprising;
  a) means for softening or melting non-crosslinked photopolymer on the imaged and exposed surface of the flexographic printing element;
  b) at least one roll that is contactable with the imaged and exposed surface of the flexographic printing element and capable of moving over at least a portion of the imaged and exposed surface of the flexographic printing element to remove the softened or melted non-crosslinked photopolymer on the imaged and exposed surface of the flexographic printing element; and
  c) means for maintaining contact between the at least one roll and the imaged and exposed surface of the flexographic printing element;
wherein a resilient compressible layer is located between the support means and the flexographic printing element in a manner such that the resilient compressible layer is not permanently attached to either the support means or the flexographic printing element.

The roll(s) preferably have a blotting material positioned around at least the portion of the roll(s) in contact with the imaged surface of the flexographic printing element. In an alternate embodiment, a doctor blade can be positioned adjacent to the roll(s) to remove non-crosslinked photopolymer from the roll(s) after it has been removed from the imaged surface of the flexographic printing element. If desired, two rolls may be used, such that the two rolls are self-centering against the imaged surface of the cylindrical printing element. In another aspect of the invention, one or more additional rolls may be positioned in an opposing position on the opposite side of the cylindrical printing element to increase resin removal from the imaged surface of the flexographic printing element and to increase imaging speed.

In one embodiment, the means for softening or melting non-crosslinked photopolymer on the imaged and exposed surface of the flexographic printing element comprises heating the at least one roll that contactable with the imaged surface of the flexographic printing element. In another embodiment of the invention, the means for softening or melting non-crosslinked photopolymer on the imaged and exposed surface of the flexographic printing element comprises positioning a heater adjacent to the imaged and exposed surface of the flexographic printing element. The heated roll and external heater can also be used together.

The invention also comprises a method of using the thermal development apparatus of the invention comprising the steps of:
a) supporting, and preferably rotating, a flexographic printing element;
b) optionally, but preferably, exposing an imaged surface of the flexographic printing element to one or more sources of actinic radiation;
c) melting or softening non-crosslinked polymer on the imaged and exposed surface of the flexographic printing element;
d) causing contact between the imaged and exposed surface of the flexographic printing element and at least one roll; and
e) rotating the at least one roll against at least a portion of the imaged and exposed surface of the flexographic printing element to remove non-crosslinked photopolymer from the imaged and exposed surface of the flexographic printing element;
wherein a resilient and compressible layer is removably placed between the support and the flexographic printing element before step (d).

BRIEF DESCRIPTION OF THE DRAWINGS

FIG. 1 depicts one embodiment of the thermal development apparatus of the instant invention.

DETAILED DESCRIPTION OF THE PREFERRED EMBODIMENTS OF THE INVENTION

The present invention relates to an improved thermal development apparatus and a method of using the apparatus to remove non-crosslinked polymer from an imaged and exposed surface of a relief image printing element during a process for manufacturing the relief image printing element.

In another embodiment, the present invention relates to an improved combined exposing and developing apparatus and a method of using the apparatus to expose the relief image printing plate to actinic radiation to selectively cure, i.e. crosslink, portions of the photopolymer layer revealed during the imaging step, and thermally developing the relief image printing plate to remove non-crosslinked polymer from the imaged and exposed surface of the relief printing element during a process for manufacturing the relief image printing element. Although the printing plate must be imaged and exposed prior to development, the imaging and exposure need not be carried out in the apparatus of the invention, but instead can be carried out separately prior to entering the apparatus of this invention. That being said, it is advantageous to carry out these processes together in one combined apparatus.

The present invention also relates to an improved combined exposing, developing, and post exposure/detack apparatus and a method of using the combined apparatus during a process for manufacturing relief image printing plates.

A flexographic printing element is produced from a photocurable printing blank by imaging and exposing the photocurable printing blank to produce a relief image on the surface of the printing element. This is generally accomplished by selectively exposing the photocurable material to actinic radiation, which exposure acts to harden or crosslink the photocurable material in the irradiated areas.

The photocurable printing blank contains one or more layers of an uncured photocurable material on a suitable backing layer. Printing elements of various sizes can be processed in the novel apparatus of the invention, limited only by the length of the cylinder or conveyor on which the printing element is supported and the length of the one or more carriages traversing the means for exposing the printing element and/or the means for thermally developing the printing element across the length of the printing cylinder. These features will be described in greater detail below.

The printing element is imaged and selectively exposed to actinic radiation in one of three related ways. In the first alternative, a photographic negative with transparent areas and substantially opaque areas is used to selectively block the transmission of actinic radiation to the printing plate element. In the second alternative, the photopolymer layer is coated with an actinic radiation (substantially) opaque layer that is sensitive to laser ablation. A laser is then used to ablate selected areas of the actinic radiation opaque layer creating an in situ negative. In the third alternative, a focused beam of actinic radiation is used to selectively expose the photopolymer. Any of these alternative methods is acceptable, with the criteria being the ability to image and selectively expose the photopolymer to actinic radiation thereby selectively curing portions of the photopolymer.

In a preferred embodiment, the printing element comprises a photopolymer layer that is coated with an actinic radiation (substantially) opaque layer, which typically comprises carbon black, and which is sensitive to laser ablation. A laser, which is preferably an infrared laser, is then used to ablate selected areas of the actinic radiation opaque layer creating an in situ negative. This technique is well-know in the art, and is described for example in U.S. Pat. Nos. 5,262,275 and 6,238,837 to Fan, and in U.S. Pat. No. 5,925,500 to Yang et al., the subject matter of each of which is herein incorporated by reference in its entirety.

The selected areas of the photopolymer layer revealed during laser ablation are then exposed to actinic radiation to crosslink and cure the portions of the photopolymer layer that are not covered by the in situ negative. The type of radiation used is dependent on the type of photoinitiator in the photopolymerizable layer. The radiation-opaque material in the infrared sensitive layer which remains on top of the photopolymerizable layer prevents the material beneath from being exposed to the radiation and thus those areas covered by the radiation-opaque material do not polymerize. The areas not covered by the radiation-opaque material are exposed to actinic radiation and polymerize and thus crosslink and cure. Any conventional sources of actinic radiation can be used for this exposure step. Examples of suitable UV sources include carbon arcs, mercury-vapor arcs, fluorescent lamps, electron flash units, electron beam units and photographic flood lamps.

Next, the photopolymer layer of the printing element is developed to remove uncured (i.e., non-crosslinked) portions of the photopolymer, without disturbing the cured portions of the photopolymer layer, to produce the relief image.

In a preferred embodiment, the novel thermal developing apparatus of the invention is combined with the exposure device so that the printing element may be exposed and developed in the same apparatus without the need to remove the printing element from the exposing apparatus to place it into the developing apparatus. In another embodiment, the apparatus further comprises a means for post exposure/detack in the same apparatus. However, this invention works equally well with a separate thermal development with having imaging separately performed before development and post exposure/detack performed separately after development.

The apparatus of the invention typically comprises:
(i) means to support, and preferably rotate, a flexographic printing element;
(ii) optionally, but preferably, means for exposing an imaged surface of the flexographic printing element to actinic radiation; and
(iii) means for thermally developing said imaged and exposed surface of the flexographic printing element, wherein the thermally developing means comprises:
a) means for softening or melting non-crosslinked photopolymer on the imaged and exposed surface of the flexographic printing element;
b) at least one roll that is contactable with the imaged surface of the flexographic printing element and capable of moving over at least a portion of the imaged surface of the flexographic printing element to remove the softened or melted non-crosslinked photopolymer on the imaged and exposed surface of the flexographic printing element; and
c) means for maintaining contact between the at least one roll and the imaged and exposed surface of the flexographic printing element;
wherein a resilient compressible layer is located between the support means and the flexographic printing element in a manner such that the resilient compressible layer is not permanently attached to the support means or the flexographic printing element.

As depicted in FIG. 1, the present invention is directed to a system 10 for forming a relief image on a photosensitive printing element 22. The system 10 of the invention comprises an enclosure 12 for housing the elements of the thermal plate processing system 10.

The plate processor 10 of the invention accepts a previously formed and imagewise actinic radiation exposed flexible photosensitive printing element 22 with the resilient compressible layer 14 thereunder. The photosensitive printing element 22 has a base layer, an adjacent layer of a radiation hardenable elastomer material (curable layer), and optionally, but preferably, an infrared sensitive layer which is used to form an in situ mask on the curable layer using laser radiation prior to exposure to actinic radiation. Suitable photosensitive printing elements usable in the invention are described in U.S. Pat. No. 5,175,092 to Martens, U.S. Pat. Nos. 5,262,275 and 6,238,837 to Fan, and U.S. Pat. Nos. 5,925,500 and 6,605,410 to Yang et al., the subject matter of each of which is herein incorporated by reference in its entirety.

A portion of the radiation curable layer is preferably cured by actinic radiation through the lower surface of the base to form a cured "floor." Next, the film is imagewise exposed from the opposite surface to cure the desired portions of the plate, preferably through the in situ mask. The remaining portion of the radiation curable layer after curing consists of cured portions and uncured portions.

A conveyor 20 attached to a drive motor (not shown) is used to transport and convey the photosensitive printing element 22 through the thermal plate processing system. The conveyor 20 is mounted in a fixed position in the enclosure 12, and comprises a continuous loop support means 21 supported by at least a first roller 23 and a second roller 24. Optionally, one or more additional rollers (not shown) may be used to provide additional support to the conveyor 20 and prevent the continuous loop 21 from sagging from the weight of the photosensitive printing element 22. In a preferred embodiment, the continuous loop support means 21 comprises wire mesh. In the alternative, the support means can be a rotatable drum.

The leading edge of the photosensitive printing element 22 and that of the resilient compressible layer 14 may be held in place against the continuous loop 21 of the conveyor 20 by suitable fastening means 16, such as a clamp and/or vacuum. If desired, a vacuum may be provided to at least one of the first roller 23 and the second roller 24 of the conveyor 20, and used, alone or in combination with fastening means 16, to hold the photosensitive printing element 22 and the resilient compressible layer 14 in place on the continuous loop 21 of the conveyor 20.

During operation, the conveyor 20 with photosensitive printing element 22 and the resilient compressible layer 14 moves in a first direction 26 towards heatable roller 28 such that the photosensitive printing element 22 with the resilient compressible layer 14 thereunder, passes through a gap 70 between the conveyor 20 and the heatable roller 28 as the continuous loop 21 of conveyor 20 rotates over and around the second roller 24. Heatable roller 28 rotates in an opposite direction 30 from the conveyor 20. Heatable roller 28 is capable of being urged towards the photosensitive printing element 22 positioned on the conveyor 20 as the conveyor moves in first direction 26 and heatable roller 28 moves in an opposite direction 30. Preferably, the heatable roller 28 is fixably mounted on a pivot (not shown), which allows it to be urged towards the conveyor 20.

In a preferred embodiment, the heatable roller 28 is urged toward the photosensitive printing element 14 on the conveyor 20 using suitable means, such as one or more pneumatic cylinders 40. The pneumatic cylinder(s) 40 positions the heatable roller 28 at a preset distance from the outer surface of the second roller 24 of the conveyor 20 to produce the gap 70 through which the photosensitive printing element 22 passes as it travels on the continuous loop 21 of the conveyor 20 around the second roller 24.

A web of absorbent material 32 is conducted over at least a portion of an outer surface 29 of the heatable roller 28. The web of absorbent material 32 is capable of absorbing (removing) material that is liquefied or softened from the photosensitive printing element 22 when the heatable roller 28 rotates and is heated and the web of absorbent material 32 contacts at least a portion of the photosensitive printing element 22. The heatable roller 28 rotates in a direction 30 opposite to the direction 26 of the conveyor 20 so that the photosensitive printing element 22 and the web of absorbent material 32 can be contacted with each other and then separated.

The pneumatic cylinder 40 is controlled to adjust the gap 70 depending on the thickness of the photosensitive printing element 22 with the resilient compressible layer 14 thereunder. The pneumatic cylinder(s) 40 causes photosensitive printing element 22 and the web of absorbent material 32 to come into contact at the gap 70 between the conveyor 20 and the heatable roller 28 as the conveyor 20 rotates in a first direction 26 and the heatable roller 28 rotates in an opposite direction 30 such that at least a portion of the liquefied or softened material is absorbed by the web of absorbent material 32.

Heat is provided to the heatable roller 28 by a core heater that is capable of maintaining a skin temperature of the heatable roller 28 that will soften or liquefy at least a portion of the photosensitive material. The temperature to which the heatable roller 28 is heated is chosen based on the composition of the photosensitive material and is based on the melting temperature of the monomers and polymers contained within the photosensitive material. Although the heatable roller 28 preferably comprises an electrical core heater to provide the desired skin temperature, the use of steam, oil, hot air, and a variety of other heating sources may also provide the desired skin temperature.

The web of absorbent material 32 is supplied to at least the portion of the outer surface of the heatable roller 28 from a supply roll 34 of the web of absorbent material 32. The specific type of absorbent material is not critical to the present invention. The selection of the absorbent material 32 depends in part upon the thickness of the photosensitive printing element 22 to be processed, the melting temperature of the web of absorbent material 32, and the heat transfer characteristics of both the photosensitive printing element 22 and the web of absorbent material 32.

The web of absorbent material 32 comes into face-to-face contact with the heatable roller 28, which in the preferred embodiment is heated to and operated at a temperature between about 120° C. and about 200° C. The upper limit is determined in large part by the melting temperature of the web of absorbent material 32. The temperature of the heatable roller 28 must also be low enough so that when the web of absorbent material 32 is not moving and the portions of the web of absorbent material 32 contacting the heatable roller 28 are at rest, the absorbent material 32 does not melt. Suitable means for maintaining uniform tension in the web of absorbent material throughout the system may be used, including for example, one or more idler rollers (not shown). Other means for maintaining tension in the web may also be provided and would be known to those skilled in the art.

It is also critical that the linear speed of the heatable roller 28, the web of absorbent material 32, and the photosensitive printing element 22 be substantially the same to avoid any shear stress on the photosensitive printing element 22, which stress is known to cause uneven relief portion plate thickness.

In a preferred embodiment, a take-up roller 36 is provided for winding the web of absorbent material 32 after processing through the plate processor. If present, the take-up roller 36 is independently belt driven by a motor 38, which is preferably a variable speed motor. The take-up roller 36 collects the web of absorbent material 32 after it has contacted the photosensitive printing element 22 and removed portions of the photosensitive material that were liquefied or softened. The speed of the motor 38 is adjusted so as to not interfere with the selected web tension. If the motor interferes with web tension, the resulting flexographic plate could potentially have variable heights in the relief portions or might warp and be commercially unacceptable.

In another optional, but preferred embodiment, the system 10 may comprise heating means 60 positioned adjacent to a point 70 where the absorbent material 32 contacts the photosensitive printing element 22 on the conveyor 20. The heating means 60 provides an auxiliary heat source to further soften and liquefy portions of the photosensitive printing element 22 on the conveyor 20.

It would be apparent to one skilled in the art that the conveyor 20, including first roller 23 and a second roller 24 as well as the heatable roller 28 are driven by suitable means, i.e., a motor. In addition, a controller, such as a microprocessor may be used in the system of the invention to control the operation of each of the elements in the plate processor 10. Such controllers are well known in the art. One example of a controller used to control the various elements in a plate processor is described in U.S. Pat. No. 5,279,697 to Peterson et al., the subject matter of which is herein incorporated by reference in its entirety.

The present invention is also directed to a method of forming a relief image on a photosensitive printing element, wherein the photosensitive printing element comprises a flexible substrate (base/layer) and at least one layer of photosensitive material deposited on the flexible substrate using the system described above.

The method comprises the steps of (1) providing a frame or enclosure; (2) positioning a photosensitive printing element on a support conveying means with the resilient compressible layer between the support conveying means and the flexographic printing element, said support conveying means comprising a continuous loop supported by at least a first roller and a second roller (or a rotating drum), wherein the photosensitive printing element and the resilient compressible layer are supported on the continuous loop; (3) supplying an absorbent material to at least a portion of an outer surface of a heatable roller that is mounted for rotation in the frame or enclosure, wherein the absorbent material is capable of absorbing material that is liquefied or softened from the photosensitive printing element when the heatable roller is heated and rotates and the absorbent material contacts at least a portion of the photosensitive printing element; (4) heating the heatable roller to a temperature sufficient to cause at least a portion of the at least one layer of photosensitive material to soften or liquefy when the absorbent material contacts the at least one layer photosensitive material; and (5) causing a surface of the at least one layer of photosensitive material and the absorbent material to come into contact at a point between the conveying means and the heatable roller such that at least a portion of the liquefied or softened material is absorbed by the absorbent material.

Preferably, the photosensitive printing element is processed through the steps of the process several times so that most, if not all of the uncured photosensitive material can be removed from the surface of the photosensitive printing element to obtain the relief image.

The resilient compressible layer should be removably located between the support means and the flexographic printing element such that it is not permanently attached to either the support means or the flexographic printing element. The resilient compressible layer serves three primary functions. First it provides a resilient cushion below the flexographic printing element which can absorb any variation in pressure applied by the hot roll when it contacts the surface of the flexographic printing element due to variations in thickness of the flexographic printing element across its surface. This ability to absorb and distribute excess pressure is believed to be of primary importance in eliminating or reducing wrinkles in the flexographic printing element. Secondly, the resilient compressible layer allows for a small amount of movement or slippage by the flexographic printing as the hot roll passes over its surface. Thirdly, the resilient compressible layer can be matched with the flexographic printing element such that the thickness of the two together adds to a specified thickness. To accomplish these objectives the resilient compressible layer should have a resiliency of from about 10 to 60 as measured by ASTM D2632. The resilient compressible layer should also have a compressibility of about 15 psi to 25 psi at 25% compression.

The resilient compressible layer can be formed using a variety of substances which will meet the resilience, compressibility, and preferably static surface coefficient of friction necessary. Suitable materials including photopolymers, polymeric materials, compressible foams, and natural or synthetic rubber. The thickness of the resilient compressible layer is generally from about 0.02 in to 0.120 in, preferably 0.04 in to 0.09 in, most preferably 0.04 in to 0.06 in. The thickness of the resilient compressible layer can be matched to the flexographic printing element such that the combined thickness of the two is a predetermined amount thereby minimizing adjustments necessary to the apparatus.

The flexographic printing element and the resilient compressible layer are typically held together on the support means with a clamp which may be assisted by suction (vacuum) force. As noted the flexographic printing element is on top with its photopolymer layer facing outward and its backing sheet resting on the upper surface of the resilient compressible layer. The resilient compressible layer is located between the flexographic printing element and the support means.

What is claimed is:

1. A system for forming a relief image on a photosensitive printing element, wherein the photosensitive printing element comprises a flexible substrate and at least one layer of photosensitive material deposited on the flexible substrate, the system comprising:
    a frame;
    a means for supporting and conveying the photosensitive printing element, wherein the photosensitive printing element is positioned on the means for supporting and conveying with a layer of resilient compressible material removably positioned between the photosensitive printing element and the means for supporting and conveying;
    a heatable roller capable of being urged towards the photosensitive printing element positioned on the means for supporting and conveying, wherein an absorbent material is conducted over at least a portion of an outer surface of the heatable roller, and wherein the absorbent material is capable of absorbing material that is liquefied or softened from the photosensitive printing element when the heatable roller is heated and rotates and the absorbent material contacts at least a portion of the photosensitive printing element; and
    means for causing the photosensitive material and the absorbent printing element to come into contact at a point between the means for supporting and conveying and the heatable roller such that at least a portion of the liquefied or softened material is absorbed by the absorbent material.

2. The system according to claim 1, further comprising delivery means for supplying the absorbent material to at least the portion of the outer surface of the heatable roller.

3. The system according to claim 1, further comprising heating means for applying heat to the photosensitive printing element on the means for supporting and conveying, wherein said heating means are positioned adjacent to a point where the absorbent material contacts the photosensitive printing element on the means for supporting and conveying.

4. The system according to claim 1 wherein the means for supporting and conveying is selected from the group consisting of a continuous conveyor and a rotating drum.

5. The system according to claim 1 wherein the layer of resilient compressible material has a resilience from 10 to 60 and a compressibility from 15 psi to 25 psi at 25% compression.

6. The system to claim 5 wherein the means for supporting and conveying is selected from the group consisting of a continuous conveyor and a rotating drum.

7. A method of forming a relief image on a photosensitive printing element, wherein the photosensitive printing element comprises a flexible substrate and at least one layer of photosensitive material deposited on the flexible substrate, the method comprising the steps of:
    providing a frame;
    positioning a photosensitive printing element on a supporting and conveying means with a layer of resilient compressible material removably positioned between the photosensitive printing element and the supporting and conveying means, said supporting and conveying means comprising a continuous loop or a rotating drum;

supplying an absorbent material to at least a portion of an outer surface of a heatable roller, said heatable roller being mounted for rotation in the frame, wherein the absorbent material is capable of absorbing material that is liquefied or softened from the photosensitive printing element when the heatable roller is heated and the absorbent material contacts at least a portion of the photosensitive printing element;

heating the heatable roller to a temperature sufficient to cause at least a portion of the photosensitive printing element to soften or liquefy when the absorbent material contacts the at least one layer photosensitive material; and causing the photosensitive material and the absorbent printing element to come into contact at a point between the conveyor and the heatable roller such that at least a portion of the liquefied or softened material is absorbed by the absorbent material.

8. The method according to claim 7, further comprising the step of applying heat to the photosensitive printing element on the conveyor by positioning a heater adjacent to a point where the absorbent material contacts the photosensitive printing element on the conveyor.

9. The method according to claim 7 wherein the means for supporting and conveying is selected from the group consisting of a continuous conveyor and a rotating drum.

10. The method according to claim 7 wherein the layer of resilient compressible material has a resilience from 10 to 60 and a compressibility from 15 psi to 25 psi at 25% compression.

* * * * *